(12) United States Patent
Kim et al.

(10) Patent No.: US 10,224,376 B2
(45) Date of Patent: Mar. 5, 2019

(54) ORGANIC PHOTOELECTRONIC DEVICE AND IMAGE SENSOR INCLUDING SELECTIVE LIGHT TRANSMITTANCE LAYER

(71) Applicants: Samsung Electronics Co., Ltd., Suwon-si, Gyeonggi-do (KR); SNU R&DB Foundation, Gwanak-gu, Seoul (KR)

(72) Inventors: Kyu Sik Kim, Yongin-si (KR); Jang-Joo Kim, Seoul (KR); Gae Hwang Lee, Seongnam-si (KR); Ryuichi Satoh, Numazu-si (JP); Yong Wan Jin, Seoul (KR); Dae-Ho Kim, Seoul (KR)

(73) Assignees: Samsung Electronics Co., Ltd., Gyeonggi-do (KR); SNU R&DB Foundation, Seoul (KR)

( * ) Notice: Subject to any disclaimer, the term of this patent is extended or adjusted under 35 U.S.C. 154(b) by 49 days.

(21) Appl. No.: 14/794,207

(22) Filed: Jul. 8, 2015

(65) Prior Publication Data

US 2016/0099430 A1    Apr. 7, 2016

(30) Foreign Application Priority Data

Oct. 2, 2014  (KR) .................. 10-2014-0133370

(51) Int. Cl.
*H01L 29/08* (2006.01)
*H01L 27/30* (2006.01)
*H01L 51/42* (2006.01)
*H01L 51/00* (2006.01)

(52) U.S. Cl.
CPC ........ *H01L 27/307* (2013.01); *H01L 51/0068* (2013.01); *H01L 51/4206* (2013.01); *H01L 51/4253* (2013.01); *H01L 2251/308* (2013.01)

(58) Field of Classification Search
CPC .... H01L 51/447; H01L 51/448; H01L 27/307
(Continued)

(56) References Cited

U.S. PATENT DOCUMENTS 7,659,499 B2    2/2010   Maehara
7,897,426 B2    3/2011   Maehara
(Continued)

FOREIGN PATENT DOCUMENTS

KR          101137392 B1    4/2012

OTHER PUBLICATIONS

Mikio Ihama, "Organic CMOS Image Sensor with Thin Panchromatic Organic Photoelectric Conversion Layer: Durability and Performance", Fujifilm Research & Development, 2010.
(Continued)

*Primary Examiner* — Matthew E. Gordon
(74) *Attorney, Agent, or Firm* — Harness, Dickey & Pierce, P.L.C.

(57) ABSTRACT

Provided is an organic photoelectronic device including a first light-transmitting electrode positioned at a light incidence side, a second light-transmitting electrode facing the first light-transmitting electrode, a photoactive layer positioned between the first light-transmitting electrode and the second light-transmitting electrode and selectively absorbing light in a given (or, alternatively, desired or predetermined) wavelength region, and a selective light transmittance layer positioned between the first light-transmitting electrode and the photoactive layer, between the second light-transmitting electrode and the photoactive layer, or between the first light-transmitting electrode and the photoactive layer and between the second light-transmitting electrode and the photoactive layer and increasing transmittance of the light in a wavelength region other than the given (or, alternatively, desired or predetermined) wavelength
(Continued)

region absorbed by the photoactive layer, and an electronic device including the image sensor is also provided.

5 Claims, 9 Drawing Sheets

(58) Field of Classification Search
USPC .......................................................... 257/40
See application file for complete search history.

(56) References Cited

U.S. PATENT DOCUMENTS

| | | |
|---|---|---|
| 8,368,784 B2 | 2/2013 | Yamaguchi |
| 8,581,270 B2 | 11/2013 | Park et al. |
| 2006/0278869 A1* | 12/2006 | Hioki ................ H01L 27/14647 257/40 |
| 2007/0012955 A1* | 1/2007 | Ihama ............... H01L 27/14621 257/233 |
| 2012/0090685 A1* | 4/2012 | Forrest .................... B82Y 10/00 136/263 |
| 2014/0091418 A1 | 4/2014 | Taguchi et al. |

OTHER PUBLICATIONS

Shunji Takada, "CMOS Color Image Sensor Overlaid with Organic Photoelectric Conversion Layers: Depression of Dark Current", Fujifilm Corporation, Research & Development Management, 2010, p. 275-278.

* cited by examiner

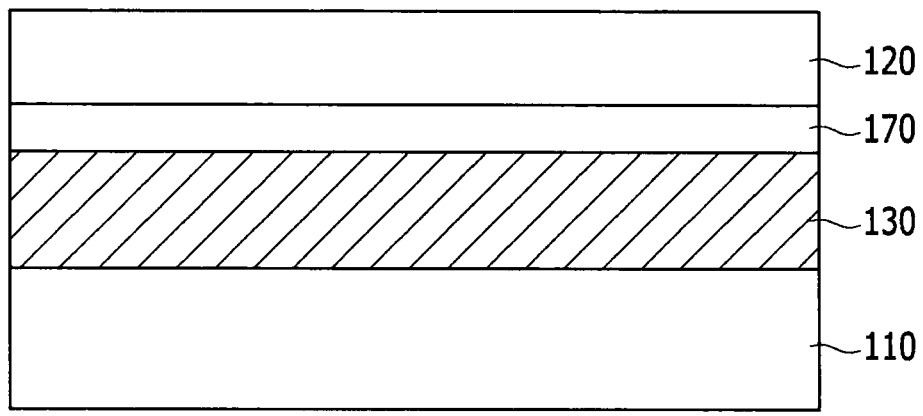
[FIG. 1]
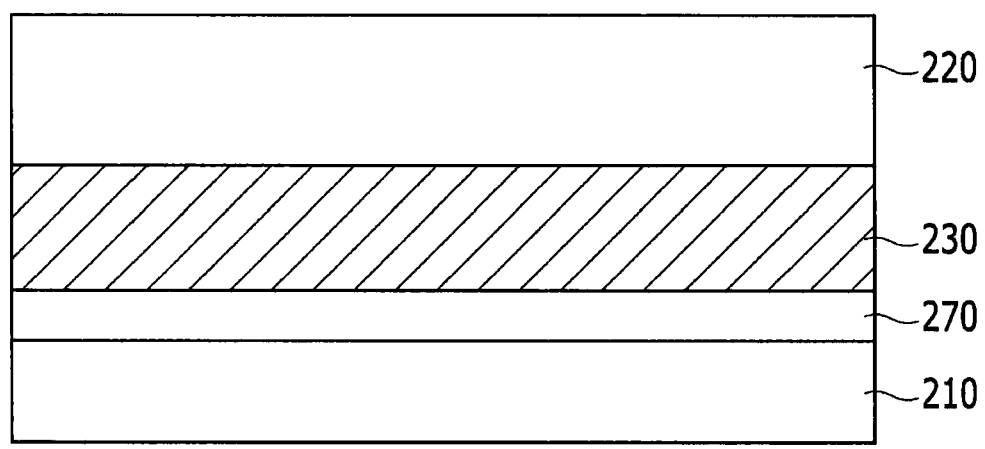
[FIG. 2]

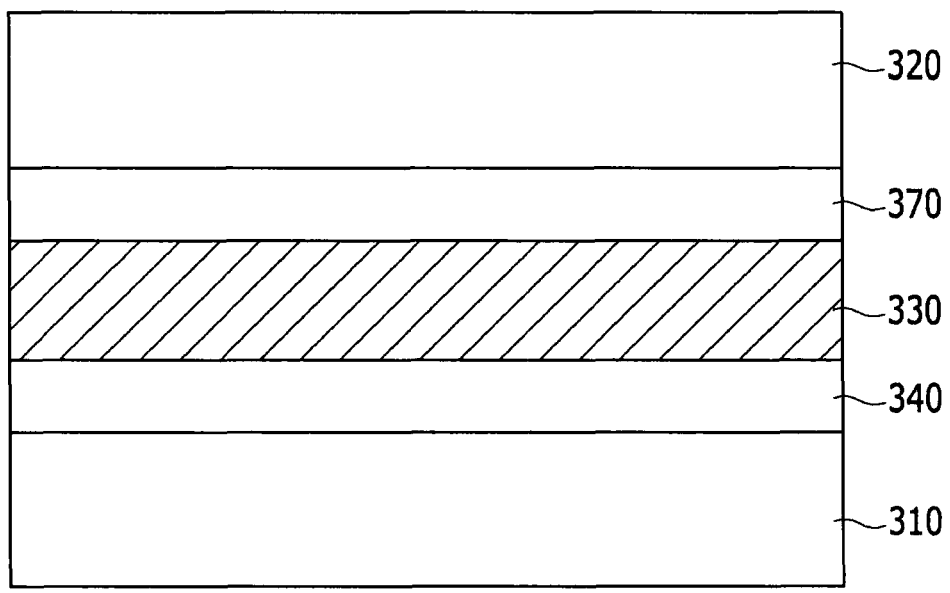
[FIG. 3]

[FIG. 4]
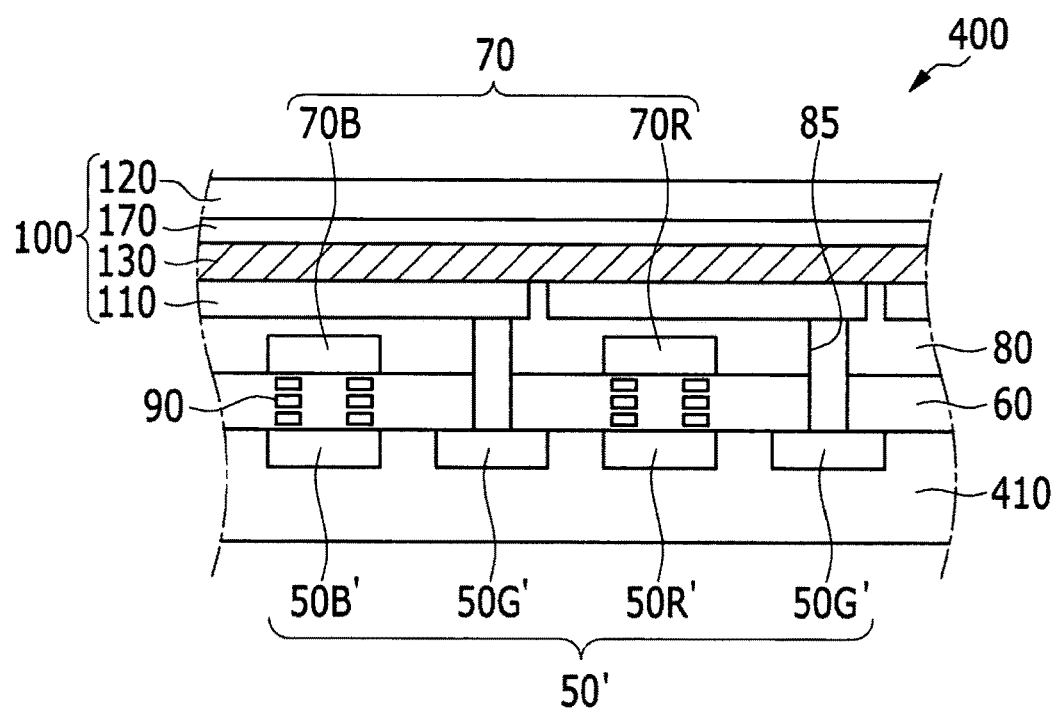

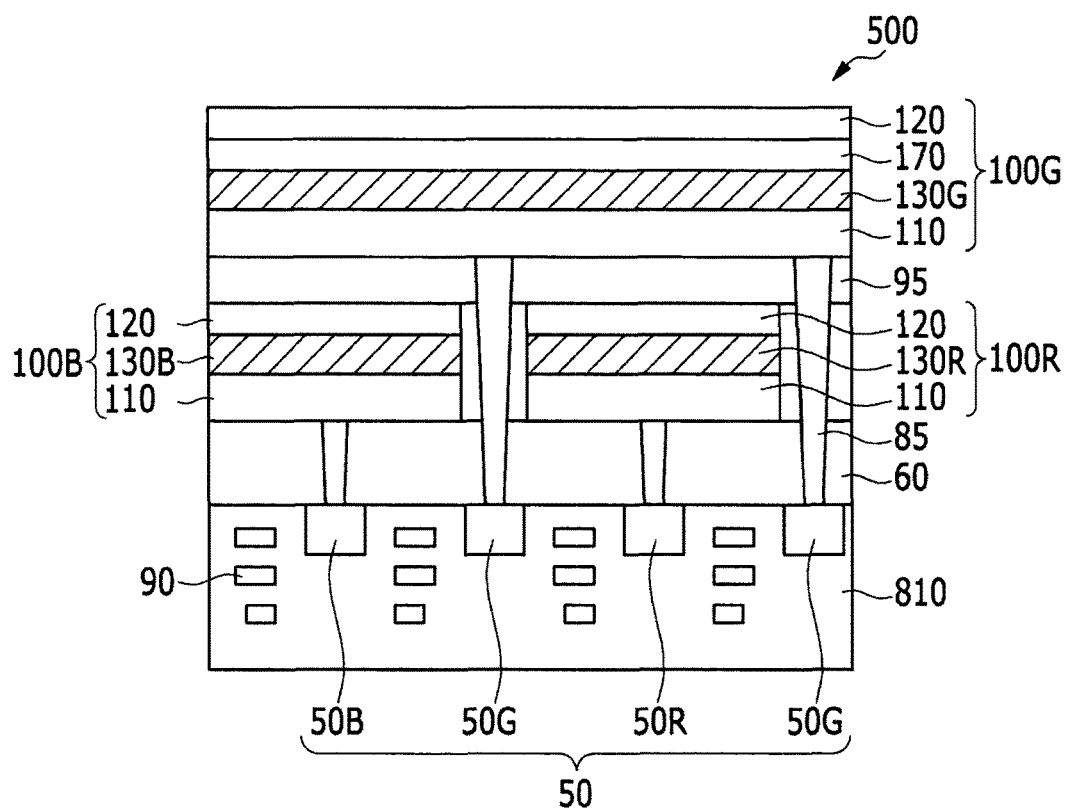
[FIG. 5]

[FIG. 6]
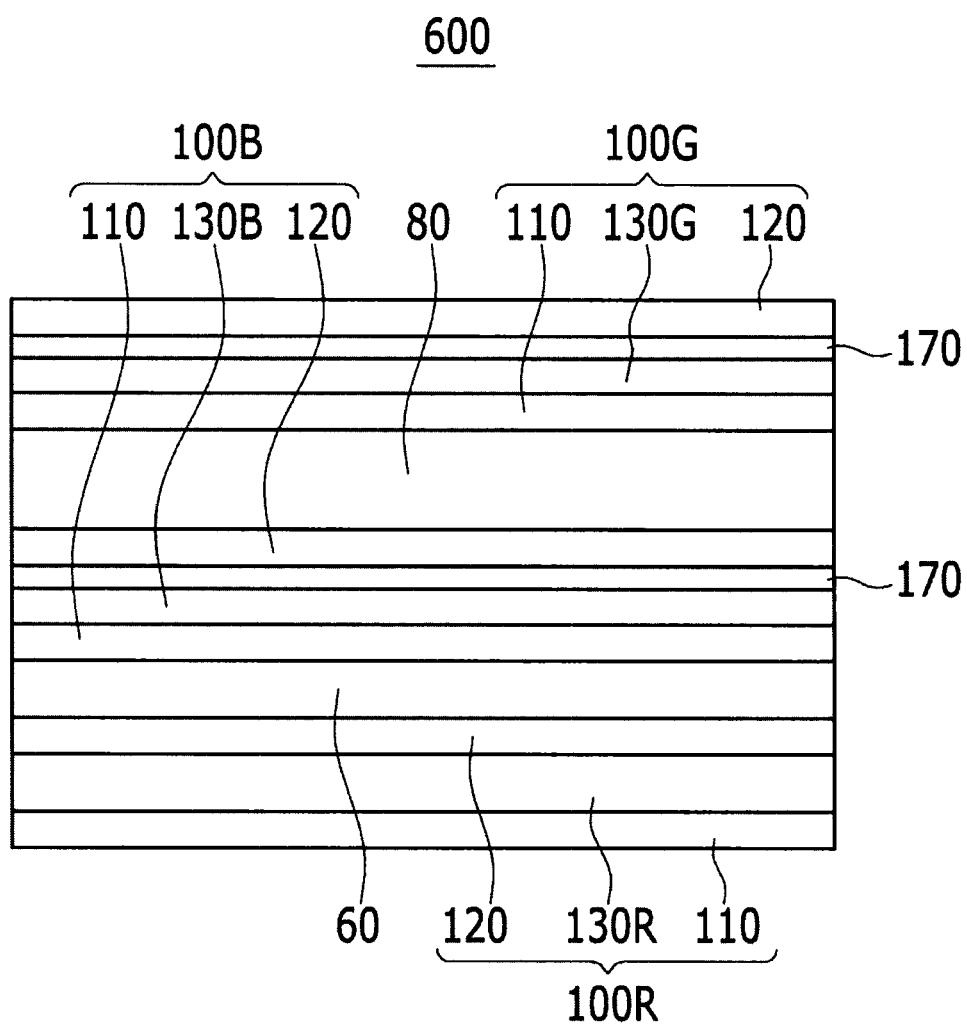

[FIG. 7]
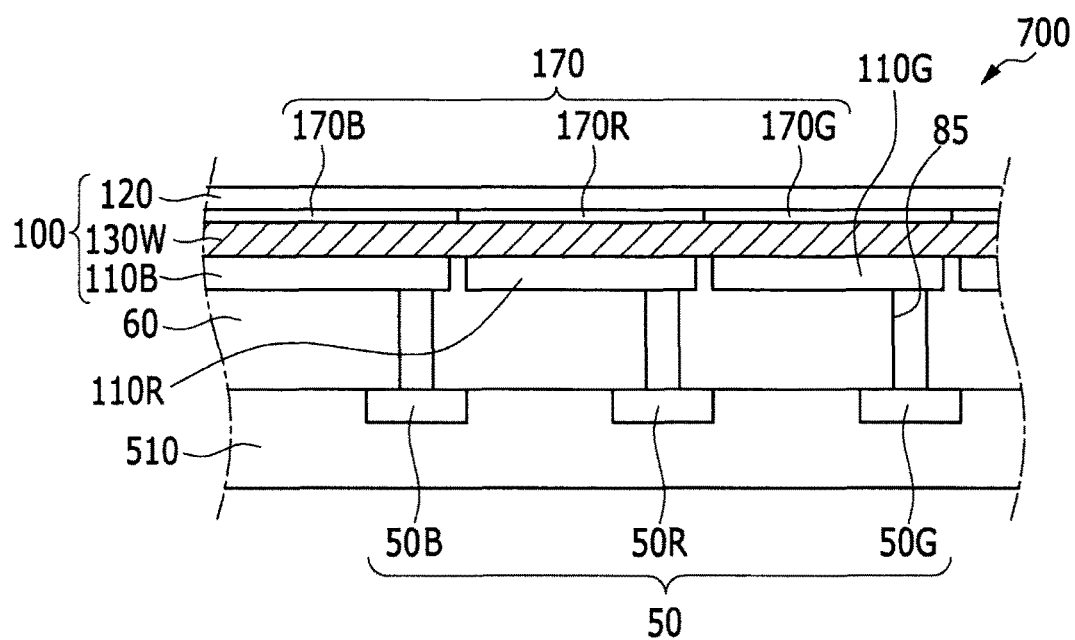

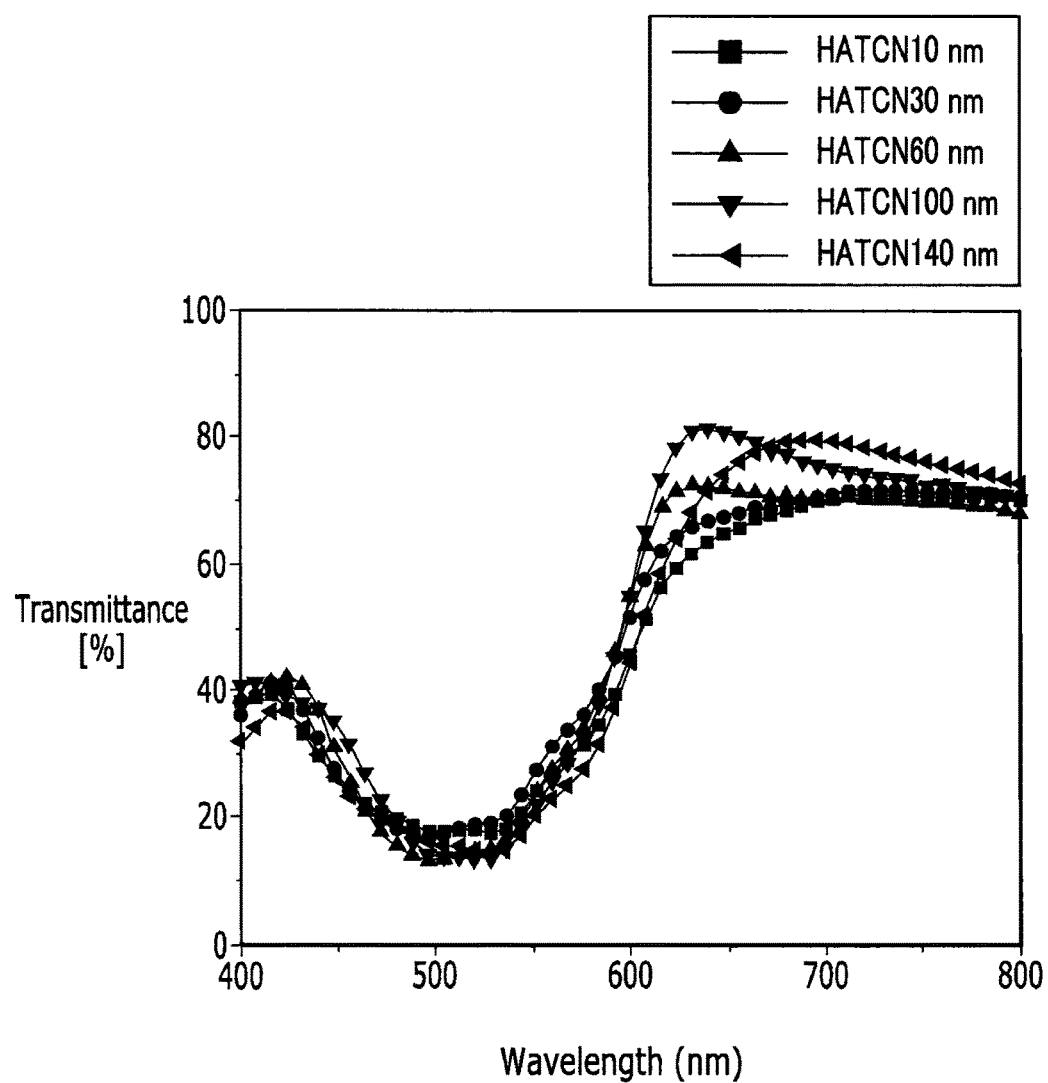
[FIG. 8]

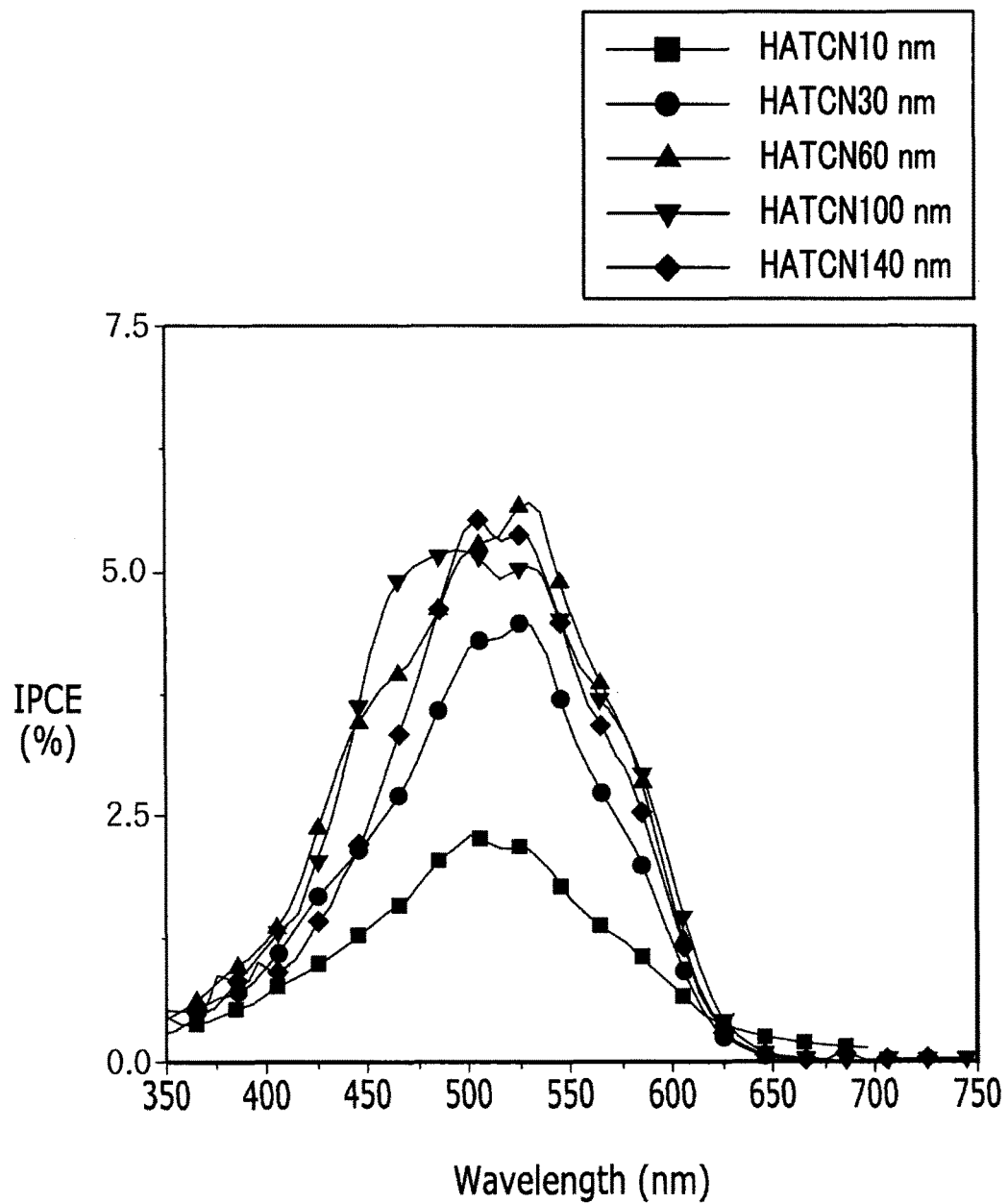
[FIG. 9]

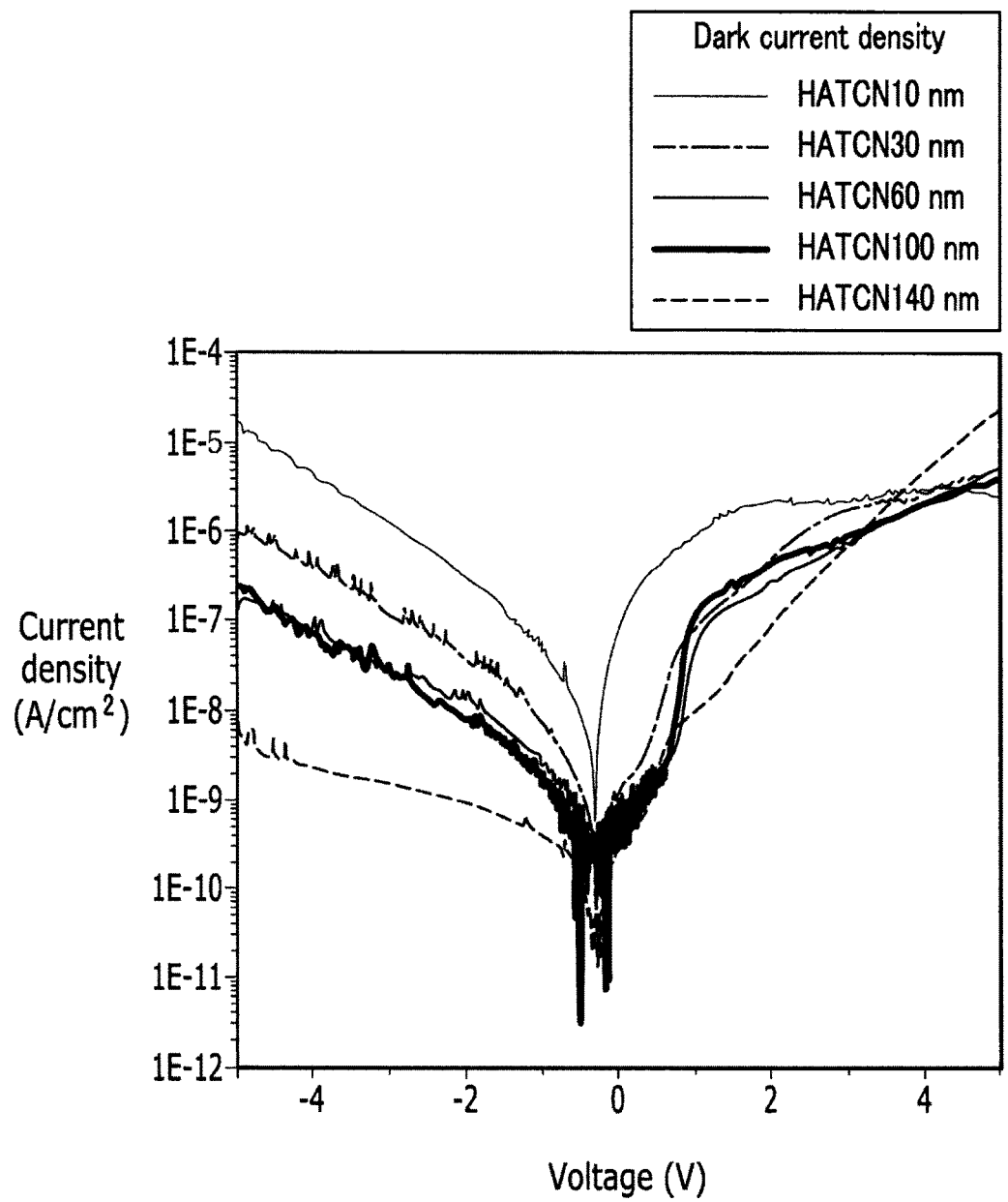
[FIG. 10]

ORGANIC PHOTOELECTRONIC DEVICE AND IMAGE SENSOR INCLUDING SELECTIVE LIGHT TRANSMITTANCE LAYER

RELATED APPLICATIONS

This application claims priority to and the benefit of Korean Patent Application No. 10-2014-0133370 filed in the Korean Intellectual Property Office on Oct. 2, 2014, the entire contents of which are incorporated herein by reference.

BACKGROUND

1. Field

An organic photoelectronic device and an image sensor are disclosed.

2. Description of the Related Art

A photoelectronic device converts light into an electrical signal using photoelectric effects. The photoelectronic device may include a photodiode, and a phototransistor, and may be used to fabricate devices such as image sensors, and solar cells.

An image sensor including a photodiode requires a high resolution and thus a small pixel size. At present, silicon photodiodes are widely used in the fabrication of image sensors. However, the silicon photodiodes have lower sensitivity because of their small absorption area and pixel size. Accordingly, an organic material that is capable of replacing silicon has been actively researched.

The organic material possesses a high extinction coefficient and selectively absorbs light in a particular wavelength region according to the molecular structure of the material. The organic material, thus, may be used to replace a photodiode and a color filter to increase the sensitivity of the image sensor. As a result, highly integrated photo electronic devices may be fabricated.

SUMMARY

Example embodiment provides an organic photoelectronic device capable of improving sensitivity and photo-efficiency by increasing wavelength selectivity for each pixel.

Example embodiment provides an image sensor including the organic photoelectronic device.

According to an example embodiment, an organic photoelectronic device includes a first light-transmitting electrode positioned at a light incidence side, a second light-transmitting electrode facing the first light-transmitting electrode, a photoactive layer positioned between the first light-transmitting electrode and the second light-transmitting electrode and selectively absorbing light in a given (or, alternatively, desired or predetermined) wavelength region, and a selective light transmittance layer positioned between the first light-transmitting electrode and the photoactive layer, between the second light-transmitting electrode and the photoactive layer, or between the first light-transmitting electrode and the photoactive layer and between the second light-transmitting electrode and the photoactive layer, wherein the selective light transmittance layer increases the transmittance of the light in a wavelength region other than the given (or, alternatively, desired or predetermined) wavelength region absorbed by the photoactive layer.

The selective light transmittance layer may be present between the first light-transmitting electrode and the photoactive layer.

The selective light transmittance layer may be present between the second light-transmitting electrode and the photoactive layer.

The selective light transmittance layer may not absorb light, and may control transmittance of a given (or, alternatively, desired or predetermined) wavelength by controlling its thickness.

The photoactive layer may selectively absorb light in a green wavelength region, and the selective light transmittance layer may increase transmittance of light in a red wavelength region, and in a blue wavelength region. The selective transmittance layer may increase the transmittance of light in both red and blue wavelength region that transmit through the photoactive layer compared with the transmittance of light without the selective light transmittance layer.

The selective light transmittance layer may increase transmittance for light in a red wavelength region that transmits through the photoactive layer.

The first light-transmitting electrode may be an anode, and the selective light transmittance layer may be positioned between the first light-transmitting electrode and the photoactive layer, and may include HATCN (1,4,5,8,9,11-hexaazatriphenylene hexacarbonitrile).

The photoactive layer may have a thickness of about 10 nm to about 500 nm, and the selective light transmittance layer may have a thickness of about 1 nm to about 500 nm.

In an example embodiment, an image sensor includes a first photo-sensing device sensing light in a first wavelength region, a second photo-sensing device sensing light in a second wavelength region, and a third photo-sensing device sensing light in a third wavelength region, wherein the first photo-sensing device and the second photo-sensing device are arranged horizontally with each other, and the third photo-sensing device is disposed on the first photo-sensing device and the second photo-sensing device that are horizontally arranged with each other. The third photo-sensing device includes a first light-transmitting electrode positioned at a light incidence side, a second light-transmitting electrode facing the first light-transmitting electrode, a photoactive layer positioned between the first light-transmitting electrode and the second light-transmitting electrode and selectively absorbing light in a third wavelength region, and a selective light transmittance layer positioned between the first light-transmitting electrode and the photoactive layer, between the second light-transmitting electrode and the photoactive layer, or between the first light-transmitting electrode and the photoactive layer and between the second light-transmitting electrode and the photoactive layer, wherein the selective transmittance layer increases the transmittance of the light in a wavelength region other than the third wavelength region absorbed by the photoactive layer.

The image sensor may include a semiconductor substrate integrated with the first photo-sensing device and second photo-sensing device that are arranged horizontally with each other, and a color filter layer including a first color filter selectively absorbing light in the first wavelength region at the region corresponding to the first photo-sensing device and a second color filter selectively absorbing light in the second wavelength region at the region corresponding to the second photo-sensing device, on the semiconductor substrate.

In an example embodiment, the image sensor may include the first photo-sensing device including a pair of electrodes facing each other and a photoactive layer interposed between the electrodes and selectively absorbing light in a first wavelength region, and the second photo-sensing device including a pair of electrodes facing each other and a photoactive layer interposed between the electrodes and selectively absorbing light in a second wavelength region, wherein a color filter is present on the first photo-sensing device and on the second photo-sensing device.

In an example embodiment, the image sensor may include the first photo-sensing device including a pair of electrodes facing each other and a photoactive layer interposed between the electrodes and selectively absorbing light in a first wavelength region, and the second photo-sensing device including a pair of electrodes facing each other and a photoactive layer interposed between the electrodes and selectively absorbing light in a second wavelength region, wherein no color filter is present on the first photo-sensing device and on the second photo-sensing device.

In an example embodiment, an image sensor includes a first photo-sensing device sensing light in a first wavelength region, a second photo-sensing device sensing light in a second wavelength region disposed on the first photo-sensing device, and a third photo-sensing device sensing light in a third wavelength region disposed on the second photo-sensing device. The third photo-sensing device includes a first light-transmitting electrode positioned at a light incidence side, a second light-transmitting electrode facing the first light-transmitting electrode, a photoactive layer positioned between the first light-transmitting electrode and the second light-transmitting electrode and selectively absorbing light in a third wavelength region, and a selective light transmittance layer positioned between the first light-transmitting electrode and the photoactive layer, between the second light-transmitting electrode and the photoactive layer, or between the first light-transmitting electrode and the photoactive layer and between the second light-transmitting electrode and the photoactive layer, wherein the selective light transmittance layer increases the transmittance of the light in a wavelength region other than the third wavelength region absorbed by the photoactive layer.

In an example embodiment, an image sensor includes a first photo-sensing device sensing light in a first wavelength region, a second photo-sensing device sensing light in a second wavelength region disposed on the first photo-sensing device, and a third photo-sensing device sensing light in a third wavelength region disposed on the second photo-sensing device.

The third photo-sensing device includes a first light-transmitting electrode positioned at a light incidence side, a second light-transmitting electrode facing the first light-transmitting electrode, a photoactive layer positioned between the first light-transmitting electrode and the second light-transmitting electrode and selectively absorbing light in a third wavelength region, and a selective light transmittance layer positioned between the first light-transmitting electrode and the photoactive layer, between the second light-transmitting electrode and the photoactive layer, or between the first light-transmitting electrode and the photoactive layer and between the second light-transmitting electrode and the photoactive layer, wherein the selective light transmittance layer increases the transmittance of the light in a wavelength region other than the third wavelength region absorbed by the photoactive layer.

The second photo-sensing device includes a first light-transmitting electrode positioned at a light incidence side, a second light-transmitting electrode facing the first light-transmitting electrode, a photoactive layer interposed between the first light-transmitting electrode and the second light-transmitting electrode and absorbing light in a second wavelength region, and a selective light transmittance layer interposed between the first light-transmitting electrode and the photoactive layer, between the second light-transmitting electrode and the photoactive layer, or between the first light-transmitting electrode and the photoactive layer and between the second light-transmitting electrode and the photoactive layer, wherein the selective light transmittance layer increases the transmittance of the light in a wavelength region other than the second wavelength region absorbed by the photoactive layer.

In the image sensor, the first photo-sensing device may be integrated in the semiconductor substrate, and a color filter may not be provided between the first photo-sensing device and the second photo-sensing device.

In the image sensor, the first photo-sensing device may include a first light-transmitting electrode positioned at a light incidence side, a second light-transmitting electrode facing the first light-transmitting electrode, and a photoactive layer positioned between the first light-transmitting electrode and the second light-transmitting electrode and absorbing light in a first wavelength region.

In the image sensor, the photoactive layer of the third photo-sensing device may include a p-type semiconductor material selectively absorbing light in a green wavelength region and an n-type semiconductor material selectively absorbing light in a green wavelength region.

The third photo-sensing device may include a selective light transmittance layer between the first light-transmitting electrode and the photoactive layer, and the selective light transmittance layer may include HATCN (1,4,5,8,9,11-hexaazatriphenylene hexacarbonitrile).

The third photo-sensing device may include a selective light transmittance layer between the first light-transmitting electrode and the photoactive layer, the photoactive layer may have a thickness of about 10 nm to about 500 nm, and the selective light transmittance layer may have a thickness of about 1 nm to about 500 nm.

The image sensor may further include a focusing lens on the third photo-sensing device.

In an example embodiment, an organic image sensor having a plurality of pixel portions on a substrate is provided. The organic image sensor includes a plurality of first pixel electrodes arranged to be spaced apart from each other while corresponding to the number of the plurality of pixel portions on the substrate; a photoactive layer in the form of a continuous film disposed on and between the first pixel electrodes, including an organic light-absorbing material that senses light in the entire visible light region, and is shared by the plurality of pixel portions; a second pixel electrode in the form of a continuous layer disposed on the photoactive layer, being shared by the plurality of pixel portions, and positioned at a light incidence side: and a plurality of selective light transmittance layers disposed corresponding to each of plurality of pixel portions between the second pixel electrode and the photoactive layer, and transmitting light in a wavelength region other than the given (or, alternatively, desired or predetermined) wavelength region sensed by each pixel portion.

BRIEF DESCRIPTION OF THE DRAWINGS

FIG. 1 is a cross-sectional view of an organic photoelectronic device according to an example embodiment, FIG. 2 is a cross-sectional view of an organic photoelectronic device according to an example embodiment, FIG. 3 is a cross-sectional view of an organic photoelectronic device according to an example embodiment, FIG. 4 is a cross-sectional view of an image sensor according to an example embodiment, FIG. 5 is a cross-sectional view of an image sensor according to an example embodiment, FIG. 6 is a cross-sectional view of an image sensor according to an example embodiment, FIG. 7 is a cross-sectional view of an image sensor according to an example embodiment, FIG. 8 is a graph showing light transmittance change of an organic photoelectronic device according to Example 1 at each wavelength depending on thickness change of a selective light transmittance layer, FIG. 9 is a graph showing external quantum efficiency (EQE) change of the organic photoelectronic device according to Example 1 depending on thickness change of the selective light transmittance layer, and FIG. 10 is a graph showing J-V characteristics of the organic photoelectronic device according to Example 1 depending on thickness change of the selective light transmittance layer and including a dark current.

DETAILED DESCRIPTION

Example embodiments will hereinafter be described in detail, and may be easily performed by those who have common knowledge in the related art. However, this disclosure may be embodied in many different forms and should not be construed as limited to the example embodiments set forth herein.

As used herein, when a definition is not otherwise provided, the term "substituted" refers to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

First, referring to FIG. 1, an organic photoelectronic device according to an example embodiment is described.

FIG. 1 is a cross-sectional view of an organic photoelectronic device according to an example embodiment.

Referring to FIG. 1, an organic photoelectronic device 100 according to an example embodiment includes a first light-transmitting electrode 120, a second light-transmitting electrode 110 facing the first light-transmitting electrode, a photoactive layer 130 positioned between the first light-transmitting electrode 120 and the second light-transmitting electrode 110 and selectively absorbing light in a given (or, alternatively, desired or predetermined) wavelength region, and a selective light transmittance layer 170 positioned between the first light-transmitting electrode 120 and the photoactive layer 130 and increasing transmittance of the light in a wavelength region other than the given (or, alternatively, desired or predetermined) wavelength region absorbed by the photoactive layer.

In an example embodiment, the first light-transmitting electrode 120 is a front side electrode positioned at the light incidence side, and the second light-transmitting electrode 110 is a rear side electrode (back side electrode) facing the first light-transmitting electrode 120. One of the first light-transmitting electrode 120 and the second light-transmitting electrode 110 is an anode and the other is a cathode.

The selective light transmittance layer 170 selectively increases transmittance of the light in a wavelength region other than the given (or, alternatively, desired or predetermined) wavelength, that is, in the given (or, alternatively, desired or predetermined) wavelength region of the light absorbed by the photoactive layer 130 from the incident light from the first light-transmitting electrode 120. While the light absorption rate of light in the given (or, alternatively, desired or predetermined) wavelength region in the photoactive layer 130 is not changed, more light in a wavelength region other than the given (or, alternatively, desired or predetermined) wavelength region can transmit through the photoactive layer 130 due to the selective light transmittance layer 170.

An organic light-absorbing material has been actively researched and developed in order to improve resolution, spectral sensitivity, and the like of an organic photoelectronic device having a photoactive layer including a conventional organic light-absorbing material selectively absorbing light in a given (or, alternatively, desired or predetermined) wavelength region. In other words, an attempt to develop an organic light-absorbing material selectively absorbing light in a desired wavelength region by changing its own structure or synthesizing it with a new material and an organic photoelectronic device including the organic light-absorbing material has been made. However, these organic light-absorbing material may absorb a lot of light in other wavelength regions as well as light in a given (or, alternatively, desired or predetermined) wavelength region, and thus a photo-sensing device disposed beneath the organic photoelectronic device and sensing light in the other wavelength regions may not sufficiently absorb light, which, as a result, deteriorates the photo-efficiency and spectral sensitivity of an image sensor and the organic photoelectronic devices.

According to an example embodiment, an organic photoelectronic device may transmit light in the rest of wavelength regions except for a given (or, alternatively, desired or predetermined) wavelength region without changing a material selectively absorbing light in the given (or, alternatively, desired or predetermined) wavelength region and included in the photoactive layer 130, and also without decreasing or changing a light absorption ratio in the given (or, alternatively, desired or predetermined) wavelength region absorbed in a photoactive layer 130 through the selective light transmittance layer 170. In other words, light transmittance in other wavelength regions except for the given (or, alternatively, desired or predetermined) wavelength region without changing or decreasing external quantum efficiency (EQE) in the given (or, alternatively, desired or predetermined) wavelength region may be improved.

The transmittance improvement may be obtained by adjusting thickness of the selective light transmittance layer 170. For example, as shown in Example 1 to be described, when an organic photoelectronic device is manufactured by using IZO (Indium Zinc Oxide) as a first light-transmitting electrode 120 and ITO (Indium Tin Oxide) as a second light-transmitting electrode 110, a mixture of p-type and n-type semiconductor materials selectively absorbing light in a green region wavelength as a photoactive layer 130, and then coating HATCN (1,4,5,8,9,11-hexaazatriphenylene hexacarbonitrile) with various thicknesses as a selective light transmittance layer 170 between the first light-transmitting electrode 120 and the photoactive layer 130. When transmittance of the organic photoelectronic device at each wavelength is measured depending on a HATCN thickness change, light transmittance in a red region wavelength increases by up to about 27% at most as the HATCN thickness increases from about 10 nm to about 140 nm, and light transmittance in a blue region wavelength increases up to about 15% at most, but light transmittance in a green region wavelength rather decreases as the HATCN thickness increases (refer to FIG. 8).

In addition, as shown in FIGS. 9 and 10, when the organic photoelectronic device of Example 1 is manufactured by changing the HATCN thickness, the organic photoelectronic device maintains excellent external quantum efficiency (EQE) and a satisfactory dark current within a HATCN thickness ranging from about 60 nm to about 140 nm.

The HATCN used in Example 1 as a selective light transmittance layer has been used as a hole transport material or an electron blocking material in an organic photoelectronic device. However, it has not been known whether this material may increase light transmittance in other wavelength regions without changing a light absorption ratio in a given (or, alternatively, desired or predetermined) wavelength region when coated to have a given (or, alternatively, desired or predetermined) thickness between an electrode and a photoactive layer in an organic photoelectronic device. In other words, an organic photoelectronic device including the selective light transmittance layer 170 formed of the HATCN turns out to more selectively absorb light in a given (or, alternatively, desired or predetermined) wavelength region of the incident light toward the photoactive layer 130 and transmit more light in other wavelength regions than an organic photoelectronic device including no selective light transmittance layer 170 without changing a material selectively absorbing light in the given (or, alternatively, desired or predetermined) wavelength region in the photoactive layer. Accordingly, color selectivity and thus photo-efficiency of the organic photoelectronic device may be increased, and its spectral sensitivity may be improved. In particular, the selective light transmittance layer 170 does not deteriorate overall external quantum efficiency (EQE) and dark current characteristics of the organic photoelectronic device.

A material having the effect of the selective light transmittance layer may be selected from materials not absorbing visible light in a given (or, alternatively, desired or predetermined) wavelength region but helping or preventing transportation of an electron and/or a hole in a conventional organic photoelectronic device. For example, when a first light-transmitting electrode as an anode and a second light-transmitting electrode as a cathode are used as in Example 1, a selective light transmittance layer formed between the first light-transmitting electrode and the photoactive layer may be formed of a material selected from those forming a hole transport layer (HTL) helping transportation of holes or an electron blocking layer (EBL) blocking inflow of electrons. On the contrary, a selective light transmittance layer formed between an electrode used as a cathode and the photoactive layer may be formed of a material selected from materials forming an electron transport layer (ETL) or a hole blocking layer (HBL).

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, 4-methoxyphenyl)-benzidine (TPD), 4-bis[N-(1-naphthyl)-N-phenylamino]biphenyl (α-NPD), m-MTDATA, 4,4',4"-tris(N-carbazolyl)-triphenylamine (TCTA), 1,4,5,8,9,11- hexaazatriphenylenehexacarbonitrile (HATCN), 1,1'-bis-(4-bis(4-methyl-phenyl)-amino-phenyl)-cyclohexane (TAPC), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4"-tris(N-carbazolyl)-triphenylamine (TCTA), 1,4,5,8,9,11-hexaazatriphenylenehexacarbonitrile (HATCN), 1,1'-bis-(4-bis(4-methyl-phenyl)-amino-phenyl)-cyclohexane (TAPC), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, and a combination thereof, but is not limited thereto.

In this way, the selective light transmittance layer may be formed of a material appropriately selected from materials for a hole transport layer (HTL), an electron blocking layer (EBL), a hole blocking layer (HBL), or an electron hydrogen layer (ETL), according to whether an electrode neighboring the selective light transmittance layer in an organic photoelectronic device is an anode or a cathode.

In addition, light transmittance of the selective light transmittance layer in other wavelength regions except for light in a given (or, alternatively, desired or predetermined) wavelength region that a photoactive layer absorbs may be controlled by adjusting thickness of a material forming the selective light transmittance layer.

As shown in FIG. 8, when thickness of HATCN forming a selective light transmittance layer in the organic photoelectronic device of Example 1 is changed from about 10 nm to about 140 nm, transmittance increases by about 27% at most in a red wavelength region (a wavelength region of greater than about 580 nm to less than or equal to about 700 nm) as the HATCN thickness increases.

In a blue wavelength region (a wavelength region of greater than or equal to about 400 nm to less than about 500 nm), transmittance increases according to the HATCN thickness but does not increase as largely as in the red region wavelength.

On the other hand, in a green wavelength region (a wavelength region of about 500 nm to about 580 nm), transmittance decreases as the HATCN thickness increases.

In other words, the HATCN for selective light transmittance in an organic photoelectronic device having a photoactive layer absorbing light in a green wavelength region turns out to decrease light transmittance in a green wavelength region (i.e., increases a light absorption rate in a green wavelength region), largely increases light transmittance in a red wavelength region, and somewhat increases light transmittance in a blue wavelength region by adjusting the HATCN thickness within a given (or, alternatively, desired or predetermined) range.

In other words, the selective light transmittance layer has transmittance selectivity for light in a given (or, alternatively, desired or predetermined) wavelength region, and accordingly, an organic photoelectronic device including the selective light transmittance layer may not need a color filter for another photo-sensing device beneath itself.

The selective light transmittance layer may control light transmittance in a given (or, alternatively, desired or predetermined) wavelength region by changing its thickness, and its thickness range may vary depending on a kind of material forming the selective light transmittance layer, thickness of a photoactive layer, transmittance range to be increased, and the like. The selective light transmittance layer may have a thickness of about 1 nm to about 500 nm, for example about 10 nm to about 200 nm, for example about 10 nm to about 180 nm, for example about 20 nm to about 150 nm, or for example about 20 nm to about 130 nm.

A person having ordinary skill in this art may easily select a material for forming the selective light transmittance layer and its thickness in order to increase light transmittance in a given (or, alternatively, desired or predetermined) wavelength region with a consideration to the factors.

The selective light transmittance layer may be formed to have a desired thickness on the photoactive layer by using a thermal deposition method, a solution process, and the like.

The selective light transmittance layer 170 may be formed of one material or a mixture of two or more materials, and may be formed as greater than or equal to two layers respectively formed of more than one material.

When the selective light transmittance layer is formed as greater than or equal to two layers, a layer near an incident side may have a smaller refractive index than a layer farther from the incident side. The reason is that as the layer near the photoactive layer has a larger refractive index, the amount of incident light toward the photoactive layer is increased.

The first light-transmitting electrode 120 and second light-transmitting electrode 110 of the organic photoelectronic device shown in FIG. 1 may be any transmitting electrode for a photoelectronic device used for manufacture of an image sensor. For example, the first light-transmitting electrode may be made of a transparent conductor such as indium tin oxide (ITO), indium zinc oxide (IZO), zinc oxide (ZnO), tin oxide (SnO), aluminum tin oxide (AlTO), and fluorine doped tin oxide (FTO), or may be a metal thin layer having a thin thickness of several nanometers or several tens of nanometers or a metal thin layer having a thin thickness of several nanometers to several tens of nanometers doped with a metal oxide.

The first light-transmitting electrode may be formed by sputtering. For example, the sputtering may be performed at a speed of about 0.05 to about 100 Å/s for about 30 s to 30 min. Specifically, the sputtering may be performed at a speed of about 0.05 to about 10 Å/s, and more specifically, at a speed of about 0.05 to about 5 Å/s within the range.

In an example embodiment, the selective light transmittance layer 170 contacts one side of the first light-transmitting electrode 120, and in this case, the first light-transmitting electrode 120 may be sputtered on the selective light transmittance layer 170.

In an example embodiment, the first light-transmitting electrode 120 may have a thickness of about 1 nm to about 200 nm, specifically, a thickness of about 1 nm to 180 nm, and more specifically, a thickness of about 1 nm to 150 nm. The first light-transmitting electrode 120 is formed in a thin thickness and thus ensures light transmittance and conductivity.

The photoactive layer 130 is a layer where p-type and n-type semiconductor materials form a pn flat junction or a bulk heterojunction, it may be formed as a single layer or multilayer, and plays a role of receiving light entering through the first light-transmitting electrode 120, producing an exciton, and then separating the exciton into a hole and an electron.

In an example embodiment, the p-type semiconductor material and the n-type semiconductor material respectively absorb light of a green wavelength region, and may show a maximum absorption peak in a wavelength region of about 500 nm to about 600 nm.

The p-type and n-type semiconductor materials may respectively have a bandgap of about 1.5 eV to about 3.5 eV, and specifically, about 2.0 eV to about 2.5 eV within the range. The p-type and n-type semiconductor materials having a bandgap within the range may absorb light of a green wavelength region and show a maximum absorption peak specifically in a wavelength region of about 500 nm to about 600 nm.

The p-type and n-type semiconductor materials may have a full width at half maximum (FWHM) ranging from about 50 nm to about 150 nm in a light absorbance curve. Herein, the FWHM is a width of a wavelength corresponding to a half of a maximum absorbance point, and a smaller width at half maximum indicates selective absorbance of light in a narrow wavelength region and a high wavelength selectivity. Accordingly, a material having a FWHM within the range may have high selectivity for a green wavelength region.

The p-type semiconductor material and the n-type semiconductor material may have a LUMO energy level difference of about 0.2 to about 0.7 eV, and specifically about 0.3 to about 0.5 eV. When the p-type semiconductor material and the n-type semiconductor material in the active layer 130 have a LUMO energy level difference within the range, external quantum efficiency (EQE) may be improved and effectively adjusted depending on a bias applied thereto.

The p-type semiconductor material may be, for example a compound such as N,N-dimethyl-quinacridone (DMQA) and a derivative thereof, diindenoperylene, dibenzo{[f,f']-4,4',7,7'-tetraphenyl}diindeno[1,2,3-cd:1',2',3'-1m]perylene, but is not limited thereto.

The n-type semiconductor material may be, for example, a compound such as dicyanovinyl-terthiophene (DCV3T) and a derivative thereof, perylene diimide, phthalocyanine and a derivative thereof, sub-phthalocyanine and a derivative thereof, or boron dipyrromethene (BODIPY) and a derivative thereof, but is not limited thereto.

Herein, the p-type and n-type semiconductor materials are respectively illustrated as a case of absorbing light of a green wavelength region, but are not limited thereto, and may selectively absorb light of a blue wavelength region or light of a red wavelength region.

When the p-type semiconductor material and the n-type semiconductor material respectively absorb light in a blue wavelength region or in a red wavelength region, the selective light transmittance layer 170 may increase light transmittance in the red wavelength region or in the green wavelength region without changing a light absorption rate in the blue wavelength region or increase light transmittance in the green wavelength region or the blue wavelength region without changing a light absorption rate in the red wavelength region.

The photoactive layer 130 may be a single layer or a multilayer. The photoactive layer 130 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor compound and the n-type semiconductor compound in a thickness ratio of about 1:100 to about 100:1. The compounds may be included in a thickness ratio ranging from about 1:50 to about 50:1 within the range, and specifically, about 1:10 to about 10:1, and more specifically, about 1:1. When the p-type and n-type semiconductors have a composition ratio within the range, an exciton may be effectively produced, and a pn junction may be effectively formed.

The p-type layer may include the p-type semiconductor compound, and the n-type layer may include the n-type semiconductor compound.

The photoactive layer 130 may have a thickness of about 1 nm to about 500 nm. Within the range, the photoactive layer 130 may have a thickness of about 5 nm to about 300 nm. When the photoactive layer 130 has a thickness within the range, the active layer may effectively absorb light, effectively separate holes from electrons, and deliver them, effectively improving photoelectric conversion efficiency.

The second light-transmitting electrode 110 may be a light-transmitting electrode, and may include at least one of indium tin oxide (ITO), indium zinc oxide (IZO), tin oxide (SnO), aluminum tin oxide (ATO), and fluorine doped tin oxide (FTO), or a metal thin film electrode, a metal oxide electrode, a conductive polymer electrode, or a combination thereof.

The organic photoelectronic device 100 may produce excitons at the inside when light enters from the first light-transmitting electrode 120 and passes through the selective light transmittance layer 170, and light in a given (or, alternatively, desired or predetermined) wavelength region is absorbed by the photoactive layer 130. Excitons are separated into holes and electrons in the photoactive layer 130, and the separated holes are transferred to the anode side, which is one of the first light-transmitting electrode 120 and the second light-transmitting electrode 110, and the separated electrons are transferred to a cathode which is the other of the first light-transmitting electrode 120 and the second light-transmitting electrode 110, so as to flow a current in the organic photoelectronic device.

In the example embodiment, the selective light transmittance layer 170 is disposed between the first light-transmitting electrode 120 and the photoactive layer 130, but the example embodiment is not limited thereto, and as shown in FIGS. 2 and 3, a selective light transmittance layer 270 may be disposed between a second light-transmitting electrode 210 and a photoactive layer 230, and two selective light transmittance layers 370 and 340 may be disposed between a first light-transmitting electrode 320 and a photoactive layer 330 and between a second light-transmitting electrode 310 and the photoactive layer 330, respectively.

Referring to FIG. 2, an organic photoelectronic device according to an example embodiment will be described.

FIG. 2 is a cross-sectional view of an organic photoelectronic device according to an example embodiment.

Referring to FIG. 2, an organic photoelectronic device 200 according to an example embodiment includes a first light-transmitting electrode 220, a second light-transmitting electrode 210, the photoactive layer 230, and the selective light transmittance layer 270, like the above embodiment. However, the organic photoelectronic device 200 according to the example embodiment includes the selective light transmittance layer 270 between the second light-transmitting electrode 210 and the photoactive layer 230, unlike the above example embodiment shown in FIG. 1.

In the organic photoelectronic device 200 according to the example embodiment, the first light-transmitting electrode 220 is a front side electrode positioned at a light incidence side, and the second light-transmitting electrode 210 is a back side electrode facing the first light-transmitting electrode 220. One of the first light-transmitting electrode 220 and the second light-transmitting electrode 210 is an anode and the other is a cathode.

In the organic photoelectronic device 200 of FIG. 2, the selective light transmittance layer 270 is formed between the second light-transmitting electrode 210 and the photoactive layer 230. In this case, when incident light from the first light-transmitting electrode 220 passes the photoactive layer 230, light in a given (or, alternatively, desired or predetermined) wavelength region is absorbed therein, while light in the other wavelength regions except for the given (or, alternatively, desired or predetermined) wavelength region passes through the selective light transmittance layer 270 and is transmitted through the second light-transmitting electrode 210. Herein, the selective light transmittance layer 270 selectively increases light transmittance in the given (or, alternatively, desired or predetermined) wavelength region of light not absorbed in the photoactive layer 230 but that is transmitted. For example, as illustrated about FIG. 1, when the photoactive layer 230 selectively absorbs light in a green wavelength region, light in red and blue wavelength regions passes and is transmitted through the selective light transmittance layer 270, and herein, the selective light transmittance layer 270 may further improve light transmittance in the red and/or blue wavelength region. Accordingly, a photo-sensing device positioned beneath the organic photoelectronic device 200 and sensing light in other wavelength regions may more efficiently sense the transmitted light. Herein, when the selective light transmittance layer 270 selectively passes light in a given (or, alternatively, desired or predetermined) wavelength region of light in a red or blue wavelength region, a photo-sensing device positioned beneath the organic photoelectronic device 200 and sensing light in the red or blue wavelength region may not have a separate color filter.

The selective light transmittance layer 270 neighbors the second light-transmitting electrode 210 and thus may be formed of a material appropriately selected depending on a kind of the second light-transmitting electrode 210. For example, when the second light-transmitting electrode 210 is used as a cathode, electrons generated from the dissociation of excitons in the photoactive layer 230 move toward the second light-transmitting electrode 210, and thus the selective light transmittance layer 270 may be formed of any material selected from materials for the electron transport layer (ETL) easily moving electrons or the hole blocking layer (HBL) blocking injection of holes. On the contrary, when the second light-transmitting electrode 210 is used as an anode, holes generated from the dissociation of the excitons in the photoactive layer 230 move toward the second light-transmitting electrode 210, and thus the selective light transmittance layer 270 may be formed of any material out of materials for the hole transport layer (HTL) easily moving holes or the electron blocking layer (EBL) blocking injection of electrons.

The materials for the electron transport layer (ETL), the hole blocking layer (HBL), the hole transport layer (HTL), and the electron blocking layer (EBL) are the same as the materials illustrated in FIG. 1 and thus will not be repeatedly described in detail here.

The selective light transmittance layer 270 may have the same thickness as illustrated in FIG. 1. In other words, the thickness of the selective light transmittance layer 270 may be appropriately adjusted by a person of ordinary skill in the art with consideration of a kind of material for the selective light transmittance layer, thickness of a photoactive layer, and improvement range of selective light transmittance.

The photoactive layer 230, the first light-transmitting electrode 220 and the second light-transmitting electrode 210 are the same as illustrated in FIG. 1 and thus will not be repeatedly illustrated in detail here.

Referring to FIG. 3, an organic photoelectronic device according to yet example embodiment will be described.

FIG. 3 is a cross-sectional view of an organic photoelectronic device according to an example embodiment.

Referring to FIG. 3, an organic photoelectronic device 300 according to the example embodiment includes the first light-transmitting electrode 320, the second light-transmitting electrode 310, and the photoactive layer 330, like the above embodiment. However, the organic photoelectronic device 300 according to the example embodiment includes a first selective light transmittance layer 370 positioned between the first light-transmitting electrode 320 and the photoactive layer 330, and a second selective light transmittance layer 340 positioned between the second light-transmitting electrode 310 and the photoactive layer 330, unlike the organic photoelectronic devices 100 and 200 shown in the FIGS. 1 and 2.

In the organic photoelectronic device 300 according to the example embodiment, the first light-transmitting electrode 320 is a front side electrode positioned at a light incidence side, and the second light-transmitting electrode 310 is a back side electrode facing the first light-transmitting electrode 320. One of the first light-transmitting electrode 320 and the second light-transmitting electrode 310 is an anode and the other is a cathode.

In the organic photoelectronic device 300 of FIG. 3, the first selective light transmittance layer 370, like the selective light transmittance layer 170 illustrated in FIG. 1, is formed between the first light-transmitting electrode 320 and the photoactive layer 330 and increases light transmittance in other wavelength regions not absorbed in the photoactive layer 330 when incident light from the first light-transmitting electrode 320 is absorbed in the photoactive layer 330, and thus makes the light in the other wavelength regions pass the photoactive layer 330. In addition, the improved light transmittance in other wavelength regions is once more improved by the second selective light transmittance layer 340 disposed between the second light-transmitting electrode 310 and the photoactive layer 330 before the light passes the second light-transmitting electrode 310.

In this case, light transmittance in the other wavelength regions except for light in a given (or, alternatively, desired or predetermined) wavelength region absorbed in the photoactive layer 330 is much improved compared with light transmittance when there is no first selective light transmittance layer 370 and/or second selective light transmittance layer 340. Accordingly, photo-efficiency of a photo-sensing device sensing light in the other wavelength regions and positioned beneath the organic photoelectronic device 300 is increased. Accordingly, the photo-sensing device positioned beneath the organic photoelectronic device 300 may not need a separate color filter sensing light in the given (or, alternatively, desired or predetermined) wavelength region.

On the other hand, since the first selective light transmittance layer 370 neighbors the first light-transmitting electrode 320, a material forming the first selective light transmittance layer 370 may be appropriately selected depending on a kind of the first light-transmitting electrode 320. For example, when the first light-transmitting electrode 320 is used as an anode, holes generated from the dissociation of excitons in the photoactive layer 330 move towards the first light-transmitting electrode 320, and thus the first selective light transmittance layer 370 may be formed of a material selected from materials forming the hole transport layer (HTL) facilitating movement of holes or the electron blocking layer (EBL) blocking injection of electrons. On the other hand, since the second light-transmitting electrode 310 is used as a cathode, the second selective light transmittance layer 340 neighboring the second light-transmitting electrode 310 may be formed of a material selected from materials forming the electron transport layer (ETL) facilitating movement of electrons generated from the dissociation of excitons in the photoactive layer 330 to the second light-transmitting electrode 310 or the hole blocking layer (HBL).

When the first light-transmitting electrode 320 and the second light-transmitting electrode 310 are formed of opposite materials, the first selective light transmittance layer 370 and the second selective light transmittance layer 340 may be formed of opposite materials.

The materials forming the electron transport layer (ETL), hole blocking layer (HBL), hole transport layer (HTL), and electron blocking layer (EBL) are the same as illustrated in FIG. 1 and thus will not be repeatedly illustrated in detail here.

The selective light transmittance layer 370 may have the thickness as illustrated in FIG. 1. In other words, the thickness may be appropriately adjusted by a person of ordinary skill in the art depending on a kind of material for the selective light transmittance layer, thickness of a photoactive layer, improvement range of selective light transmittance, and the like.

The photoactive layer 330, the first light-transmitting electrode 320, and the second light-transmitting electrode 310 are the same as illustrated in FIG. 1 and thus will not be repeatedly illustrated in detail here.

The organic photoelectronic device may be applied to a solar cell, an image sensor, a photo-detector, a photo-sensor, and an organic light emitting diode (OLED), but is not limited thereto.

Hereinafter, an example of an image sensor including the organic photoelectronic device is described referring to drawings.

FIG. 4 is a schematic cross-sectional view of an organic CMOS image sensor according to an example embodiment.

Referring to FIG. 4, one example of the adjacent blue pixel, green pixel, and red pixel is illustrated, but is not limited thereto. Hereinafter, the constituent elements having reference numbers including "B" are constituent elements included in the blue pixel, the constituent elements having reference numbers including "G" are constituent elements included in the green pixel, and the constituent elements having reference numbers including "R" are constituent elements included in the red pixel.

Referring to FIG. 4, an organic CMOS image sensor 400, according to an example embodiment, includes a semiconductor substrate 410 integrated with a photo-sensing device 50' and a transmission transistor (not shown), a lower insulation layer 60, a color filter 70, an upper insulation layer 80, and an organic photoelectronic device 100.

The semiconductor substrate 410 may be a silicon substrate, and is integrated with the photo-sensing device 50' and the transmission transistor (not shown). The photo-sensing device 50' may be a photodiode, or may store charges generated in the organic photoelectronic device 100. The photo-sensing device 50' and the transmission transistor may be integrated in each pixel, and as shown in the drawing, the photo-sensing device 50' includes a blue pixel photo-sensing device 50B', a green pixel photo-sensing device 500', and a red pixel photo-sensing device 50R'. The photo-sensing device 50' senses light, and the information sensed by the photo-sensing device 50' is transferred by the transmission transistor.

Metal wires 90 and pads (not shown) are formed on the semiconductor substrate 410. In order to decrease signal delay, the metal wires 90 and pads may be made of a metal having low resistivity, for example, aluminum (Al), copper (Cu), silver (Ag), and alloys thereof, but is not limited thereto.

The lower insulation layer 60 is formed on the metal wires 90 and the pads. The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing each photo-sensing device 50B', 500', and 50R' of each pixel. The trench may be filled with fillers.

The color filter 70 is formed on the lower insulation layer 60. The color filter 70 includes a blue filter 70B formed in the blue pixel and a red filter 70R filled in the red pixel. In the example embodiment, a green filter is not included, but a green filter may be further included.

The upper insulation layer 80 is formed on the color filter 70. The upper insulation layer 80 eliminates a step caused by the color filters 70 and smooths the surface. The upper insulation layer 80 and lower insulation layer 60 may include a contact hole (not shown) exposing a pad, and a through-hole 85 exposing the photo-sensing device 500' of a green pixel.

The organic photoelectronic device 100 is formed on the upper insulation layer 80. The organic photoelectronic device 100 includes the first light-transmitting electrode 120, the selective light transmittance layer 170, the photoactive layer 130, and the second light-transmitting electrode, as described above.

The photoactive layer 130 includes a p-type semiconductor material selectively absorbing light in a green wavelength region and an n-type semiconductor material, as described above, and thus photoelectrically converts the light into a green wavelength.

Incident light from the first light-transmitting electrode 120 passes the selective light transmittance layer 170 and reaches the active layer 130, wherein light in a green wavelength region may be mainly absorbed and photoelectrically converted. On the other hand, light in the other wavelength regions is more than a case of including no selective light transmittance layer 170, and thus may pass the second light-transmitting electrode 110 and be absorbed in blue and red pixels through the color filters 70B and 70R.

FIG. 5 is cross-sectional view of an organic CMOS image sensor according to example embodiment.

Referring to FIG. 5, an organic CMOS image sensor 500 according to the example embodiment includes a first organic photoelectronic device 100R, a second organic photoelectronic device 100B, and a third organic photoelectronic device 100G that absorb light in each different wavelength region from each other.

The first organic photoelectronic device 100R includes a photoactive layer 130R selectively absorbing light in a red wavelength region, the second organic photoelectronic device 100B includes a photoactive layer 130B selectively absorbing light in a blue wavelength region, and the third organic photoelectronic device 100G includes a photoactive layer 130G selectively absorbing light in a green wavelength region. Accordingly, the organic photoelectronic devices may selectively absorb light for given (or, alternatively, desired or predetermined) wavelength regions without a separate color filter.

The third organic photoelectronic device 100G is positioned on the first organic photoelectronic device 100R and the second organic photoelectronic device 100B that are horizontally parallel to each other, and includes the selective light transmittance layer 170 beneath the first light-transmitting electrode 120. Accordingly, light in a green region of the incident light transmitted through the first light-transmitting electrode 120 is mainly absorbed in the photoactive layer 130 and may be photoelectrically converted. In addition, light in other red and blue regions is more than a case of including no selective light transmittance layer 170, and thus passes the second light-transmitting electrode 110 and may be absorbed in the first organic photoelectronic device 100B and the second organic photoelectronic device 100R, and accordingly, photoelectric efficiency of the first organic photoelectronic device 100R and the second organic photoelectronic device 100B may be further increased.

An insulation layer 95 is formed between the third organic photoelectronic device 100G and the second organic photoelectronic device 100B and the first organic photoelectronic device 100R.

The third organic photoelectronic device 100G is electrically connected to a green charge storage device 500, the first organic photoelectronic device 100R is electrically connected to a red charge storage device 50R, and the second organic photoelectronic device 100B is electrically connected to a blue charge storage device 50B.

The metal wire 90 is positioned beneath the charge storage device 50. However, the example embodiment is not limited thereto, and the metal wire 90 may be positioned on the charge storage device 50.

The insulation layer 60 is formed on a semiconductor substrate 810 in which the metal line 90 and the charge storage device 50 are integrated, and the first organic photoelectronic device 100R and second organic photoelectronic device 100B are arranged in parallel on the insulation layer 60.

FIG. 5 shows the organic photoelectronic device 100 of FIG. 1 applied to the third organic photoelectronic device 100G, but the example embodiment is not limited thereto, and the organic photoelectronic device 200 of FIG. 2 or the organic photoelectronic device 300 of FIG. 3 may be applied thereto.

In an example embodiment, the organic photoelectronic devices 100G, 100B, and 100R and respective charge storage devices 50R, 50B, and 50G of the organic CMOS image sensor 500 may be electrically connected via conductors disposed in the through holes 85.

In an example embodiment, blue charge storage devices 50B, red charge storage device 50R, and green charge storage device 50G may also function as a pixel photo sensing devices for blue color, and red color and green color of light respectively. When blue charge storage devices 50B, red charge storage device 50R, and green charge storage device 50G function as pixel photo sensing devices, the through-holes 85 expose the pixel photo sensing devices 50B, 50R, and 50G to the light that is transmitted through the organic photoelectronic devices 100B, 100R, and 100G.

FIG. 6 is a cross-sectional view of an image sensor according to example embodiment.

Referring to FIG. 6, in an organic CMOS image sensor 600 according to the example embodiment, the first organic photoelectronic device 100R, the second organic photoelectronic device 100B, and the third organic photoelectronic device 100G respectively absorbing light in different wavelength regions are sequentially stacked from bottom to top.

The first organic photoelectronic device 100R includes a photoactive layer 130R selectively absorbing light in a red wavelength region, the second organic photoelectronic device 100B includes a photoactive layer 130B selectively absorbing light in a blue wavelength region, and the third organic photoelectronic device 100G includes a photoactive layer 130G selectively absorbing light in a green wavelength region.

The third organic photoelectronic device 100G positioned on top includes the selective light transmittance layer 170 beneath the first light-transmitting electrode 120, and thus light in a green region of the incident light passing through the first light-transmitting electrode 120 is mainly absorbed in the photoactive layer 130G and photoelectrically converted. The intensity of the light transmitted through the light transmittance layer 170 (of the third organic photoelectronic device 100G) in red and blue regions is higher than the intensity of the light (red and blue regions) transmitted through the third organic photoelectronic device 100G that does not include the selective light transmittance layer 170. The light transmitted through the photoelectronic device 100G may be absorbed in the second organic photoelectronic device 100B through the second light-transmitting electrode 110. Accordingly, photo-efficiency of the second organic photoelectronic device 100B may be further increased.

In addition, according to the example embodiment, the selective light transmittance layer 170 may be included between the first light-transmitting electrode 120 and the photoactive layer 130B in the second organic photoelectronic device 100B positioned in the middle. Accordingly, blue region of the incident light passing through the first light-transmitting electrode 120 of the second organic photoelectronic device 100B is absorbed in the photoactive layer 130B and photoelectrically converted. The intensity of light transmitted through the light transmittance layer 170 in the red region is higher than the intensity of the light (red region) transmitted through the photoelectronic device 100B that does not include the selective light transmittance layer 170 and thus is absorbed in the first organic photoelectronic device 100R through the second light-transmitting electrode 110. The photoactive layer 130R of the first organic photoelectronic device 100R mainly absorbs light in a red region wavelength, and thus photo-efficiency of the first organic photoelectronic device 100R may be further increased due to the selective light transmittance layer 170 in the second organic photoelectronic device 100B.

The lower insulation layer 60 is formed between the first organic photoelectronic device 100R and the second organic photoelectronic device 100B, while an upper insulation layer 80 is formed between the second organic photoelectronic device 100B and the third organic photoelectronic device 100G.

The first organic photoelectronic device 100R may be electrically connected to a red charge storage (not shown), the second organic photoelectronic device 100B may be electrically connected to a blue charge storage (not shown), and the third organic photoelectronic device 100G may be electrically connected to a green charge storage (not shown).

FIG. 6 schematically shows a stacking structure of the first organic photoelectronic device 100R, the second organic photoelectronic device 100B and the third organic photoelectronic device 100G, but does not show a semiconductor substrate positioned beneath the first organic photoelectronic device 100R by disposing an insulation layer (not shown). In the semiconductor substrate, each charge storage devices are electrically connected to the organic photoelectronic devices via a metal wire, and the like. The charge storage devices, the organic photoelectronic devices and connecting metal wires are integrated with the semiconductor substrate.

FIG. 6 shows that the organic photoelectronic device 100 of FIG. 1 applying the selective light transmittance layer 170 between the first light transmitting electrode 120 and the photoactive layer 130 is respectively applied to the third organic photoelectronic device 100G and the second organic photoelectronic device 100B, but the example embodiment is not limited thereto, and the organic photoelectronic devices 200 or 300 of FIG. 2 or 3 instead of the organic photoelectronic device 100 may be applied to these organic photoelectronic devices. In addition, FIG. 6 shows that the selective light transmittance layer 170 is formed in the second organic photoelectronic device 100B and the third organic photoelectronic device 100G, but may be formed in either one of the second organic photoelectronic device 100B and the third organic photoelectronic device 100G.

Furthermore, FIG. 6 shows that red, blue, and green photo-sensing devices are all organic photodiodes, but one of these devices may be an inorganic photodiode. For example, the inorganic photodiode may be disposed instead of the first organic photoelectronic device at the bottom in FIG. 6.

In FIGS. 4 to 6, a pair of transparent electrodes consisting of each organic photoelectronic device, a photoactive layer absorbing light in a given (or, alternatively, desired or predetermined) wavelength region between the transparent electrodes, and a selective light transmittance layer disposed between either one of the pair of electrodes and the photoactive layer are the same as illustrated in FIGS. 1 to 3.

Hereinafter, referring to FIG. 7, an organic CMOS image sensor according to example embodiment is illustrated.

FIG. 7 is a cross-sectional view of an image sensor according to an example embodiment.

Referring to FIG. 7, an organic CMOS image sensor 700 according to the example embodiment includes a semiconductor substrate 510 in which a blue charge storage 50B electrically connected to a blue photo-sensing device, a red charge storage 50R electrically connected to a red photo-sensing device, and a green charge storage 50G electrically connected to a green photo-sensing device are integrated, an insulation layer 60 formed on the semiconductor substrate, a lower electrode 110B of the blue photo-sensing device, a lower electrode 110R of the red photo-sensing device, and a lower electrode 110G of the green photo-sensing device spaced apart from one another on the insulation layer, and a photoactive layer 130W formed as a continuous layer on these lower electrodes and sensing light in a full visible ray region.

On the photoactive layer 130W, an upper electrode 120 as a continuous light-transmitting electrode is formed, a selective light transmittance layer 170B increasing light transmittance except for light in a blue wavelength region is formed between the photoactive layer 130W and the upper electrode 120, a selective light transmittance layer 170R increasing light transmittance except for light in a red wavelength region, and a selective light transmittance layer 170G increasing light transmittance except for light in a green wavelength region are formed to correspond to each pixel portions defined by each lower electrode 110B, 110R, and 110G.

Unlike the aforementioned image sensors 400, 500, and 600 according to FIGS. 4 to 6, in the image sensor 700 according to the example embodiment, an organic photoelectronic device corresponding to each pixel does not include a photoactive layer selectively absorbing light in each given (or, alternatively, desired or predetermined) wavelength region per each pixel, but includes the common photoactive layer 130W shared by all the pixels and sensing light in a full visible ray region as shown in FIG. 7. In other words, the photoactive layer 130W absorbs light in a full visible ray region including blue, red, and green and is continuously applied all over the lower electrodes 110B, 110R, and 110G of each pixel. In addition, according to the example embodiment, the upper electrode 120 is also not applied to each pixel but is included as one continuous layer on the photoactive layer 130W.

However, in the image sensor according to the example embodiment, selective light transmittance layers 170B, 170R, and 170G between the continuous photoactive layer 130W and the continuous upper electrode 120 are respectively applied in each pixel to correspond to each region defined by the lower electrodes of each pixel, so that they may selectively absorb or transmit light in each wavelength region. Accordingly, in the image sensor 700 according to the example embodiment, each pixel may sense light in each selective wavelength region without a separate color filter even though incident light through the upper electrode 120 passes through the photoactive layer 130W sensing light in a full visible ray region. In other words, the image sensor 700 according to the example embodiment includes each selective light transmittance layer 170B, 170R, and 170G distinguished according to each pixel and does not need a separate color filter even though one common photoactive layer 130W is included.

The selective light transmittance layers 170B, 170R, and 170G may be formed by depositing each selective light transmittance layer on the photoactive layer 130W before forming the upper electrode 120 in the same chamber during manufacture of the organic photoelectronic device, unlike the color filter separately manufactured outside of the organic photoelectronic device, that is, on the organic photoelectronic device, and thus is more advantageous than the color filter in terms of a cost and a process. In addition, since the selective light transmittance layer 170 basically does not absorb a particular light while the color filter itself absorbs a particular light, the selective light transmittance layer 170 is more advantageous in terms of photo-efficiency.

In the image sensor according to the example embodiment, the photoactive layer 130W sensing light in a full visible ray region may absorb light in a full visible ray region ranging from about 400 nm to about 700 nm. The photoactive layer 130W may include p-type and n-type semiconductor materials, and for example, at least one of the p-type and n-type semiconductor materials may absorb light in a full visible ray region.

The photoactive layer 130W may include at least two selected from, for example, polyaniline; polypyrrole; polythiophene; poly(p-phenylenevinylene); benzodithiophene; thienothiophene; MEH-PPV (poly[2-methoxy-5-(2'-ethylhexyloxy)-1,4-phenylene vinylene); MDMO-PPV (poly(2-methoxy-5-(3,7-dimethyloctyloxy)-1,4-phenylene-vinylene); pentacene; perylene; poly(3,4-ethylenedioxythiophene) (PEDOT), poly(3-alkylthiophene); poly((4,8-bis(octyloxy)benzo(1,2-b:4,5-b')dithiophene)-2,6-diyl-alt-(2-((dodecyloxy)carbonyl)thieno(3,4-b)thiophenediyl)-3,6-diyl) (PTB1); poly((4,8-bis(2-ethylhexyloxy)benzo[1,2-b:4,5-b'] dithiophene)-2,6-diyl-alt-(2-((2-ethyl hexyloxy)carbonyl)-3-fluorothieno[3,4-b]thiophenediyl)-3,6-diyl) (PTB7); phthalocyanine; tin (□) phthalocyanine (SnPc); copper phthalocyanine; triarylamine; benzidine; pyrazoline; styrylamine; hydrazone; carbazole; thiophene; 3,4-ethylenedioxythiophene (EDOT); pyrrole; phenanthrene; tetracene; naphthalene; rubrene; 1,4,5,8-naphthalene-tetracarboxylic dianhydride (NTCDA); Alq3; fullerene (C60, C70, C74, C76, C78, C82, C84, C720, C860, and the like); 1-(3-methoxy-carbonyl)propyl-1-phenyl(6,6)C61 (PCBM); fullerene derivatives such as C71-PCBM, C84-PCBM, and bis-PCBM; an inorganic semiconductor such as CdS, CdTe, CdSe, and ZnO; a derivative thereof, and a copolymer thereof, but is not limited thereto.

The image sensor according to the example embodiment has the same constitution as illustrated in FIGS. 4 to 6 except for what is illustrated above. In other words, the materials forming the first light-transmitting electrode 120, the second light-transmitting electrodes 110B, 110R, and 110G, and the selective light transmittance layer 170 and their thicknesses are the same as illustrated above.

Each image sensor is manufactured in the above method, and then microlens may be formed on the image sensor.

Hereinafter, the present disclosure is illustrated in more detail with reference to examples. However, these are example embodiments, and the present disclosure is not limited thereto.

Manufacture of Organic Photoelectronic Device

Example 1

An about 150 nm-thick lower electrode is formed by sputtering ITO (Indium Tin Oxide) on a glass substrate. Subsequently, on the lower electrode, $Rb_2CO_3$ is thermally deposited to form an about 1 nm-thick lower charge auxiliary layer. On the lower charge auxiliary layer, dicyanovinyl-terthiophene (DCV3T) is thermally deposited to be 5 nm thick, dicyanovinyl-terthiophene (DCV3T):N,N'-dimethylquinacridone (DMQA) in a ratio of 1:1 to be 110 nm thick and DMQA is deposited to be 5 nm thick in order to form a photoactive layer, 1,1'-bis-(4-bis(4-methyl-phenyl)-amino-phenyl)-cyclohexane (TAPC) is deposited to be 15 nm thick to form a hole transport layer (HTL), and 1,4,5,8,9,11-hexaazatriphenylenehexacarbonitrile (HATCN) is thermally deposited to be respectively 10 nm, 30 nm, 60 nm, 100 nm, and 140 nm thick thereon to form a selective light transmittance layer. On each HATCN layer having a different thickness, IZO (Indium Zinc Oxide) is respectively sputtered at a speed of 0.87 Å/s for 1384 seconds (DC 300 W, Chamber pressure of 2 mTorr, Ar at 30 sccm, $O_2$ at 0.62 sccm) to form an about 120 nm-thick upper electrode, manufacturing an organic photoelectronic device.

Evaluation

Evaluation 1: Transmittance

Transmittance of the organic photoelectronic device according to Example 1 in each wavelength region is evaluated depending on thickness of the selective light transmittance layer HATCN.

The transmittance is measured by using an ultraviolet (UV)-visible ray spectrophotometer (VARIAN Carry 5000 UV-visible spectrophotometer), and the results are provided in FIG. 8.

FIG. 8 provides a graph showing transmittance change of the organic photoelectronic device at each wavelength as a HATCN thickness is changed.

Referring to FIG. 8, as the HATCN thickness increases from 10 nm to 140 nm, the transmittance gradually increases in a wavelength region ranging from greater than or equal to 580 nm to less than or equal to 700 nm, while the transmittance rather decreases in a wavelength region ranging from greater than or equal to about 500 nm to less than or equal to 600 nm. In addition, the transmittance increases in a wavelength region of greater than or equal to about 400 nm to less than 500 nm as the HATCN thickness increases, but the transmittance increase ratio is smaller than the increase ratio in the wavelength region of greater than or equal to 580 nm to less than or equal to 700 nm.

In conclusion, in the organic photoelectronic device including a photoactive layer selectively absorbing light in a green wavelength region according to Example 1, color selectivity may be increased by adjusting a HATCN thickness thus largely increasing light transmittance in a red wavelength region and somewhat increasing light transmittance in a blue wavelength region while maintaining or increasing a light absorption rate in a green wavelength region. In addition, when another organic photoelectronic device absorbing light in a red region wavelength is disposed beneath the organic photoelectronic device, photoefficiency may be improved.

Evaluation 2: External Quantum Efficiency

External quantum efficiency (EQE) of the organic photoelectronic device according to Example 1 is evaluated depending on a HATCN thickness change.

The external quantum efficiency (EQE) is measured by using an IPCE measurement system (Oriel, US). First of all, the IPCE measurement system is calibrated by using a Si photodiode (Newport, US), and then the organic photoelectronic devices respectively having a different HATCN thickness according to Example 1 are respectively mounted on the system, and their external quantum efficiency in a wavelength range of about 400 to 700 nm is measured. Herein, there is a bias of 1 V.

The obtained results are provided in FIG. 9.

Referring to FIG. 9, when the organic photoelectronic devices according to Example 1 have a HATCN thickness of about 60 nm to 140 nm, sufficient external quantum efficiency (EQE) is obtained in a green wavelength region of about 450 nm to about 600 nm.

Evaluation 3: Dark Current

Dark current of the organic photoelectronic devices according to Example 1 depending on a HATCN thickness change is evaluated.

The dark current is evaluated by respectively applying a reverse bias to the organic photoelectronic devices respectively having a different HATCN thickness according to Example 1 and measuring their current change depending on a voltage. The results are provided in FIG. 10.

Referring to FIG. 10, the organic photoelectronic devices respectively having a different HATCN thickness according to Example 1 show more satisfactory dark current as the HATCN thickness increases from 10 nm to 140 nm.

While this disclosure has been described in connection with what is presently considered to be practical example embodiments, it is to be understood that the example embodiment is not limited to the disclosed example embodiments, but, on the contrary, is intended to cover various modifications and equivalent arrangements included within the spirit and scope of the appended claims.

What is claimed is:
1. An image sensor comprising:
a first photo-sensing device sensing light in a first wavelength region;
a second photo-sensing device sensing light in a second wavelength region;
a third photo-sensing device sensing light in a third wavelength region; and a metal wiring layer between the first and second photo-sensing devices and the third photo-sensing device, wherein the first photo-sensing device and the second photo-sensing device are arranged horizontally with each other, and the third photo-sensing device is disposed on the first photo-sensing device and the second photo-sensing device that are horizontally arranged with each other, the third photo-sensing device includes a first light-transmitting electrode at a light incidence side, a second light-transmitting electrode facing the first light-transmitting electrode, an organic photoactive layer between the first light-transmitting electrode and the second light-transmitting electrode and selectively absorbing light in a desired wavelength region, and at least one selective light transmittance layer between the first light-transmitting electrode and the organic photoactive layer, the at least one selective light transmittance layer including HATCN (1,4,5,8,9,11-hexaazatriphenylene hexacarbonitrile).

2. The image sensor of claim 1, wherein the image sensor comprises:

a semiconductor substrate integrated with the first photo-sensing device and second photo-sensing device; and a color filter layer including a first color filter selectively absorbing light in the first wavelength region at a position corresponding to the first photo-sensing device and a second color filter selectively absorbing light in the second wavelength region at a position corresponding to the second photo-sensing device, on the semiconductor substrate, wherein the color filter layer is between the metal wiring layer and the second light-transmitting electrode.

3. The image sensor of claim 1, wherein the organic photoactive layer of the third photo-sensing device comprises a p-type semiconductor material selectively absorbing light in a green wavelength region and an n-type semiconductor material selectively absorbing light in a green wavelength region.

4. The image sensor of claim 1, wherein the organic photoactive layer is about 10 nm to about 500 nm thick, and the at least one selective light transmittance layer is about 1 nm to about 500 nm thick.

5. The image sensor of claim 1, which further comprises a focusing lens on the third photo-sensing device.

* * * * *